(12) United States Patent
Zhou et al.

(10) Patent No.: US 9,203,379 B2
(45) Date of Patent: Dec. 1, 2015

(54) ELECTRONIC INDUCTANCE CIRCUIT FOR THE POWER SUPPLY OF A 2-WIRE BUS INTERCOM SYSTEM AND A DEVICE THEREOF

(75) Inventors: Dalin Zhou, Fujian (CN); Yangpeng Zhang, Fujian (CN); Mingyuan Liu, Fujian (CN)

(73) Assignee: ABB Technology Ltd., Zurich (CH)

( * ) Notice: Subject to any disclaimer, the term of this patent is extended or adjusted under 35 U.S.C. 154(b) by 0 days.

(21) Appl. No.: 14/347,342

(22) PCT Filed: Apr. 16, 2012

(86) PCT No.: PCT/CN2012/074135
§ 371 (c)(1),
(2), (4) Date: Mar. 26, 2014

(87) PCT Pub. No.: WO2013/155669
PCT Pub. Date: Oct. 24, 2013

(65) Prior Publication Data
US 2014/0232370 A1 Aug. 21, 2014

(51) Int. Cl.
*H03H 1/00* (2006.01)
*H03H 11/48* (2006.01)
(Continued)

(52) U.S. Cl.
CPC ........... *H03H 11/48* (2013.01); *H03H 11/0427* (2013.01); *H04M 19/00* (2013.01)

(58) Field of Classification Search
CPC .......... H03H 11/48; H03H 1/00; G05F 1/625; G05F 1/63; G05F 1/652; G05F 1/1656
USPC ......... 327/374–377, 380, 427, 541, 543, 581; 323/218, 364, 369, 370
See application file for complete search history.

(56) References Cited

U.S. PATENT DOCUMENTS 3,112,418 A * 11/1963 Peras ............................... 310/95
3,879,687 A * 4/1975 Daehlin et al. ................ 359/238
(Continued)

FOREIGN PATENT DOCUMENTS

JP 4-165808 A 6/1992
JP 4-312012 A 11/1992
(Continued)

OTHER PUBLICATIONS

ISA/CN International Search Report issued Jan. 24, 2013 re PCT Application No. PCT/CN2012/074135, filed Apr. 16, 2012.

*Primary Examiner* — Gary L Laxton
(74) *Attorney, Agent, or Firm* — Robert A. Jefferis; Driggs, Hogg, Daugherty & Del Zoppo Co., LPA

(57) ABSTRACT

The present invention discloses an electronic inductance circuit for the power supply of a 2-wire bus intercom system and a device thereof. The electronic inductance circuit comprises a main circuit path along an inductor and a source terminal and a drain terminal of a FET between the input terminal and the output terminal of said electronic inductance circuit, in which said inductor is connected to said source terminal of said FET; a resistor and a freewheeling diode individually connected to said inductor in parallel; and a secondary circuit path along a capacitor connected with a second resistor in series between said input terminal and said output terminal, which is connected to said main circuit path in parallel. The solutions of the present invention achieve larger direct current power supply for the 2-wire intercom system and stable alternating current impedance with fast response to the DC power supply.

10 Claims, 2 Drawing Sheets

(51) Int. Cl.
*H04M 19/00* (2006.01)
*H03H 11/04* (2006.01)

(56) References Cited

U.S. PATENT DOCUMENTS

| | | | |
|---|---|---|---|
| 6,087,823 A | | 7/2000 | Sekiguchi et al. |
| 7,443,232 B2 * | | 10/2008 | Bladh .......................... 327/581 |
| 8,508,201 B2 * | | 8/2013 | Kawashima .................. 323/282 |
| 2009/0066264 A1 * | | 3/2009 | Huang et al. .................. 315/294 |
| 2009/0085656 A1 * | | 4/2009 | Havanur ....................... 327/581 |

FOREIGN PATENT DOCUMENTS

| | | |
|---|---|---|
| JP | 3881360 B2 | 2/2007 |
| JP | 4079671 B2 | 4/2008 |

* cited by examiner

ELECTRONIC INDUCTANCE CIRCUIT FOR THE POWER SUPPLY OF A 2-WIRE BUS INTERCOM SYSTEM AND A DEVICE THEREOF

RELATED APPLICATION

This application is a national filing of PCT application Serial No. PCT/CN2012/074135, filed Apr. 16, 2012.

FIELD OF THE INVENTION

The invention relates to the intercom system technical field, and more particularly to an electronic inductance circuit for the power supply of a 2-wire bus intercom system and a device thereof.

BACKGROUND OF THE INVENTION

In order to implement a 2-wire video intercom system, the direct current power, the video carrier signal, the audio signal and the command data signal have to be transmitted on a common 2-wire bus simultaneously. Therefore, the power supply circuits of the system power supply and devices thereof have to comprise an inductance component connected to the common bus in series, which allows the direct current passing whilst also suppresses the alternating current signal. However, it is common sense to the skilled person in art that the audio signal frequency is low to 300 Hz if a coil inductor is used as the inductance component. In order to achieve the sufficient impedance and power supply capacity as well, the size of such inductor shall become very large. Usually an electronic inductance circuit can be used to replace the coil inductor to reduce its size. Due to the conventional inductance circuit with an alternating current feedback resistor in series in the main current path, the direct current power supply capability and the alternating current impedance are limited; hence the size of 2-wire video intercom system is limited.

In particular, U.S. Pat. No. 6,087,823A published a conventional electronic inductance circuit. FIG. 1 and FIG. 2 illustrate a kind of conventional electronic inductance circuit individually. As shown in FIG. 1, the electronic inductance circuit EL1 comprises a P-channel FET Q1, resistors R1, R2 and a capacitor C1, wherein the terminal AI as an input terminal and the terminal AO as an output terminal. Between terminals AI and AO, a main current path is formed along the drain terminal D and the source terminal S of the P-channel FET Q1 and the resistor R1 connected in series. Also between terminals AI and AO, the resistor R2 and the capacitor C1 are connected in series, which is connected to the main path in parallel. Furthermore, the connection node B1 between the resistor R2 and capacitor C1 is connected to the Gate terminal G of the FET Q1.

Taking FIG. 1 as an example, when connecting AI to a regulated direct current power supply and connecting AO to a device load, the voltage across the capacitor C1 can't be changed transiently; i.e., $U_{C1}=0$, $U_{GS}=0$ and Q1 is still turned off. The voltage of AO will be dropped to the reference GND by device load that $U_{AI}-U_{AO}=U_{AI}=U_{R2}$, so C1 will be charged by the resistor R2. When the voltage across C1 is larger than the gate threshold voltage of the FET Q1, the Q1 starts to be turned on. When the current I1 reaches the required current value of the device load, the charging of the capacitor C1 will be stopped and $U_{GD}=0$, therefore, the voltage drop of the electronic inductance circuit EL1 is represented by equation (1) as below:

$$U_{EL1}=U_{AI}-U_{AO}=U_{R1}+U_{SG}=I_1*R_1+U_{SG} \quad (1)$$

Next, as to the alternating current impedance of the electronic inductance EL1, if a fluctuation voltage ΔU occurs at the terminal of AO, then the fluctuation voltage across C1 is $\Delta U_{C1}=\Delta U*Z_{C1}/(R2+Z_{C1})$. Meanwhile $\Delta U_{C1}=\Delta U_{SG}+\Delta U_{R1}=\Delta I1/gm+\Delta I1*R1$, so $\Delta U*Z_{C1}/(R2+Z_{C1})=\Delta I1/gm+\Delta I1*R1$. Therefore, the alternating current impedance $Z_{EL1}$ between the terminals AI and AO is represented by equation (2) as below:

$$Z_{EL1}=(R1+Z_{Q1})//(R2+Z_{C1})=\{(1+R1*gm)/gm\}*\{(R2+Z_{C1})/Z_{C1}\}//(R2+Z_{C1}) \quad (2)$$

Wherein, $Z_{C1}=1/(j*\omega*C1)=1/(j*2*\pi*f)$, "gm" represents the trans-conductance of the FET Q1.

When the electronic inductance circuit EL1 allows direct current passing, it is preferable to make the voltage drop $U_{EL1}$ represented by equation (1) small and direct current respond promptly. On the other hand, the alternating current impedance $Z_{EL1}$ represented by equation (2) shall be sufficiently larger than the cable loop resistance of intercom system, what's more it does not change with the direct current changing.

FIG. 2 illustrates a similar electronic inductance circuit EL2 to the one in FIG. 1. The main differences lie in that an N-channel FET in the electronic inductance circuit EL1 is used instead of a P-channel FET Q1 in FIG. 1. Correspondingly, each part of the circuit in FIG. 2 is arranged contrarily to the one in FIG. 1. In this way, the equations (1) and (2) described above are also applicably to represent the voltage drop and alternating current impedance between the terminal AI and AO of the electronic inductance circuit respectively.

According to the above description, it's obvious to the skilled person in art that the voltage drop $U_{EL1}$ between the terminals AI and AO of the electronic inductance circuit EL1 represented by the above equation (1) is the sum of voltage drop across R1 and $U_{SG}$ during the current is I1. Usually, we can select a FET with an appropriate $U_{GS}$ so that the voltage drop $U_{SD}$ between the FET source terminal and drain terminal is also appropriate, hence the audio signal transmitted at the bus will not be distorted and the voltage is not too large. But the voltage drop across R1 is linearly proportional to vale of R1 and I1, when a large scale of intercom system is wanted with dozens of video intercom devices in parallel connected to the common bus, the direct current I1 will become very large; so does the voltage drop of R1, which means the consumption of R1 will become large.

In order to decrease the voltage drop and consumption of R1, the R1 has to be very small. But according to the equation (2), if the R1 is not sufficiently large, the $Z_{EL1}$ is also proportional to the value of R1. If the R1 is reduced insufficiently, the $Z_{EL1}$ will be insufficient. According to the equation (2), if R1 is not sufficiently large, the $Z_{EL1}$ will be changed and depend on the trans-conductance gm of FET Q1. Because the gm is affected by the direct current $I_L$ through the Q1, so the $Z_{EL1}$ will decrease with the increase of the direct current $I_L$. If the direct current larger than 1 A is desired, the $Z_{EL1}$ will be insufficient for the audio signal transmission.

Furthermore, the $Z_{EL1}$ has to be sufficient for the audio signal transmitted in a low frequency as 300 Hz, but according to the equation (2), the $Z_{EL1}$ is a first-order relationship with frequency. Hence, the $Z_{EL1}$ decreases from 300 Hz to a lower frequency slowly, this means the electronic inductance circuit response to direct current power supply is very slow.

In summary, according to the equation (2), the resistance of R1 has to be sufficiently large to achieve a sufficient alternating current impedance in the conventional electronic inductance circuit with a resistance component for alternating current feedback, whilst according to the equation (1), the resistance of R1 has to be sufficiently small to achieve a sufficiently low voltage drop and power consumption. Consequently, existing solutions including the prior art mentioned above can't supply large direct current with sufficient alternating current impedance simultaneously. Due to the above mentioned problems, the present invention is to propose an electronic inductance circuit for the power supply of a 2-wire bus intercom system and a device thereof.

SUMMARY OF THE INVENTION

The main object of the present invention is to provide a large direct current with sufficiently large alternating current impedance for the electronic inductance circuit. Hence, the present invention provides an electronic inductance circuit for the power supply of a 2-wire bus intercom system and a device thereof.

According to an aspect of the present invention, it provides an electronic inductance circuit for the power supply of a 2-wire bus intercom system. The electronic inductance circuit comprises: a main circuit path along an inductor and a source terminal and a drain terminal of a FET between the input terminal and the output terminal of the electronic inductance circuit, in which the inductor is connected to the source terminal of the FET; a resistor and a freewheeling diode individually connected to the inductor in parallel; and a secondary circuit path along a capacitor connected with a second resistor in series between the input terminal and the output terminal, which is connected to the main circuit path in parallel.

According to another preferred embodiment of the present invention, the inductor and the FET are connected in series.

According to another preferred embodiment of the present invention, the electronic inductance circuit further comprises a second diode, connected to the source terminal and the drain terminal of the FET in parallel.

According to another preferred embodiment of the present invention, the node between the capacitor and the second resistor is connected with the gate terminal of the FET.

According to another preferred embodiment of the present invention, the FET is a P-channel FET.

According to another preferred embodiment of the present invention, the drain terminal of the P-channel FET is connected to the output terminal.

According to another preferred embodiment of the present invention, the inductor is connected between the input terminal and the source terminal of the P-channel FET.

According to another preferred embodiment of the present invention, the FET is an N-channel FET.

According to another preferred embodiment of the present invention, the source terminal of the N-channel FET is connected to the input terminal.

According to another preferred embodiment of the present invention, the inductor is connected between the source terminal of the N-channel FET and the output terminal.

Embodiments of the present invention provide an electronic inductance circuit for the power supply of a 2-wire bus intercom system and a device thereof, which achieves larger direct current power supply for the 2-wire intercom system and stable alternating current impedance with fast response to the DC power supply.

BRIEF DESCRIPTION OF THE DRAWINGS

The subject matter of the invention will be explained in more details in the following description with reference to preferred exemplary embodiments which are illustrated in the drawings, in which.

DETAILED DESCRIPTION OF PREFERRED EMBODIMENTS

Exemplary embodiments of the present invention are described in conjunction with the accompanying drawings hereinafter. For the sake of clarity and conciseness, not all the features of actual implementations are described in the specification.

The present invention is to provide an electronic inductance circuit with low power consumption; meanwhile such electronic inductance circuit is also to perform stable alternating current impedance, which does not change depending on the direct current change. Hence, the present invention provides an electronic inductance circuit for the power supply of a 2-wire bus intercom system, wherein the circuit comprises: a main circuit path along an inductor and a source terminal and a drain terminal of a FET between the input terminal and the output terminal of said electronic inductance circuit, in which said inductor is connected to said source terminal of said FET; a resistor and a freewheeling diode individually connected to said inductor in parallel; a secondary circuit path along a capacitor connected with a second resistor in series between said input terminal and said output terminal, which is connected to said main circuit path in parallel.

Figure 1:
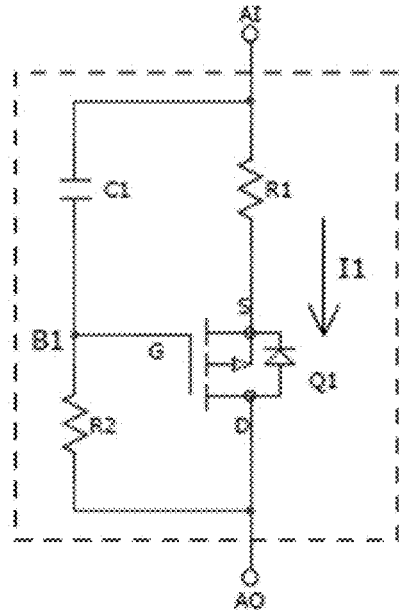
FIG. 1 illustrates a circuit diagram of a kind of the conventional electronic inductance circuit with a P-channel FET according to the prior art.
Figure 2:
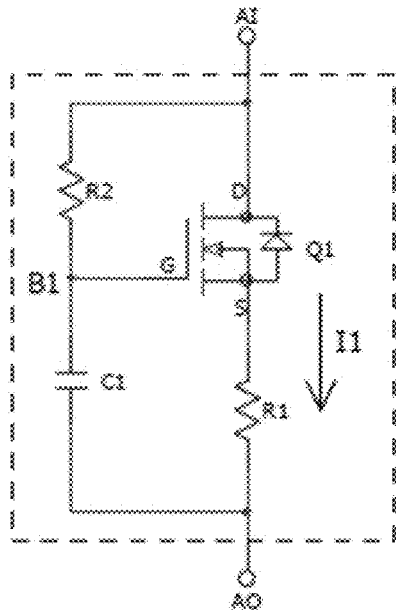
FIG. 2 illustrates a circuit diagram of another kind of the electronic inductance circuit with an N-channel FET according to the prior art.
Figure 3:
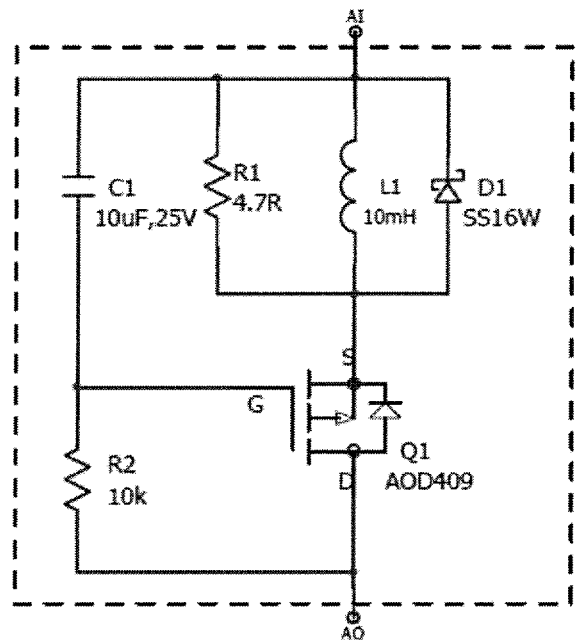
FIG. 3 illustrates a circuit diagram of a kind of the electronic inductance circuit with a P-channel FET for the power supply of a 2-wire bus intercom system according to a preferred embodiment of the present invention.

For example, FIG. 3 illustrates a circuit diagram of a kind of the electronic inductance circuit with a P-channel FET for the power supply of a 2-wire bus intercom system according to a preferred embodiment of the present invention.

As shown in FIG. 3, the electronic inductance circuit EL2 comprises a capacitor C1, a resistor R1, a coil inductor L1, a freewheeling diode D1, a second resistor R2, a P-channel FET Q1 and a second diode. In detail, a main circuit path between the input terminal AI and the output terminal AO of the electronic inductance circuit is along the inductor L1 and the source terminal as well as the drain terminal of the P-channel FET Q1, and the inductor L1 and the FET Q1 are connected in series. Furthermore, the inductor L1 is connected between AI terminal and the source terminal of the FET Q1, both the resistor R1 and the freewheeling diode D1 are individually connected to the inductor L1 in parallel, the drain terminal of said P-channel FET Q1 is connected to the output terminal, and the connection node B1 between the capacitor C1 and the second resistor R2 is connected to the Gate terminal of the P-channel FET Q1. The electronic inductance circuit further comprises a second diode connected to said source terminal and said drain terminal of said FET in parallel. Such second diode is a general diode embedded in the MOSFET, configured to prevent the $V_{DS}$ from over-voltage.

Taking the embodiment of FIG. 3 as an example, R1 is a key factor of the AC impedance of the circuit and can be set as about 4.7Ω. In an actual embodiment, the AC impedance of the circuit is up to about 2 kΩ. As to the inductor L1, it shall be chosen to make the AC impedance $ZL=2*\pi*f*L$ far larger than 4.7Ω under the 300~3400 Hz frequency. For the capacitor C1, the value shall be able to ensure about 300 Hz of the filter cutoff frequency. When connecting AI to a regulated DC power supply and AO to a device load (i.e. a current load), the voltage across the capacitor C1 can't be changed transiently. I.e., $U_{C1}=0$, $U_{GS}=0$, and Q1 is still turned off. The voltage of AO will be dropped to the reference GND by device load that $U_{AI}-U_{AO}=U_{AI}=U_{R2}$, so the capacitor C1 will be charged by the resistor R2. When the voltage across C1 is larger than the gate threshold voltage of the FET Q1, the Q1 starts to be turned on. When the current I1 reaches the required current value of the device load, the charging of the capacitor C1 will be stopped and $U_{GD}=0$, therefore, the voltage drop of electronic inductance EL2 is $U_{EL2}=U_{AI}-U_{AO}=U_{Z1}+U_{SG}$.

As the DC resistance value of the coil inductor L1 is far less than the auxiliary resistor R1, so the AC impedance of Z1 is mainly determined by the coil inductor L1 that $Z1=R_{L1}//R1 \approx R_{L1}$; therefore, the voltage drop of the electronic inductance EL2 is represented by equation (3) as below:

$$U_{EL2}=U_{AI}-U_{AO}=I1*R_{L1}+U_{SG} \quad (3)$$

Wherein the DC resistance value of the coil inductor is sufficiently small in comparison to the resistance value of the resistor R1 that $Z1=R_{L1}//R1 \approx R_{L1}$.

Next, as to the alternating current impedance of the electronic inductance EL2, if a fluctuation voltage ΔU occurs at the terminal of AO, then the fluctuation voltage across C1 is $\Delta U_{C1}=\Delta U*Z_{C1}/(R2+Z_{C1})$. Meanwhile $\Delta U_{C1}=\Delta U_{SG}+\Delta U_{R1}=\Delta I1/gm+\Delta I1*Z1$, so $\Delta U*Z_{C1}/(R2+Z_{C1})=\Delta I1/gm+\Delta I1*Z1$; therefore $R1+Z_{Q1}=\Delta U/\Delta I1=(1+Z1*gm)*(R2+Z_{C1})/(Z_{C1}*gm)=\{(1+Z1*gm)/gm\}*\{(R2+Z_{C1})/Z_{C1}\}$ As the alternating current impedance value of coil inductor L1 is much large than auxiliary resistor, so the alternating current impedance of Z1 is determined by the auxiliary resistor R1 that $Z1=R_{L1}//R1 \approx R1$, so $R1+Z_{Q1}=\Delta U/\Delta I1=(1+Z1*gm)*(R2+Z_{C1})/(Z_{C1}*gm) \approx \{(1+R1*gm)/gm\}*\{(R2+Z_{C1})/Z_{C1}\}$ Therefore, the alternating current impedance $Z_{EL2}$ between the terminals AI and AO is represented by equation (4) as below:

$$\begin{aligned} Z_{EL2} &= (R1+Z_{Q1}) // (R2+Z_{C1}) \\ &= \{(1+Z1*gm)/gm\}*\{(R2+Z_{C1})/Z_{C1}\} // (R2+Z_{C1}) \\ &\approx \{(1+R1*gm)/gm\}*\{(R2+Z_{C1})/Z_{C1}\} // (R2+Z_{C1}) \end{aligned} \quad (4)$$

Wherein, $Z_{C1}=1/(j*\omega*C1)=1/(j*2*\pi*f)$ and "gm" represents the trans-conductance of the FET.

When the electronic inductance circuit EL2 allows DC passing, it is preferable to make the voltage drop $U_{EL2}$ represented by the equation (3) small and DC respond quickly. On the other hand, the alternating current impedance $Z_{EL2}$ represented by equation (4) shall be sufficiently larger than the cable loop resistance of intercom system, what's more it does not change depending on the change of DC.

It's obvious to the skilled person in art that the electronic inductance circuit EL2 can use an N-channel FET to construct the similar circuit as the power supply of a 2-wire bus intercom system instead of the P-channel FET.

Figure 4:
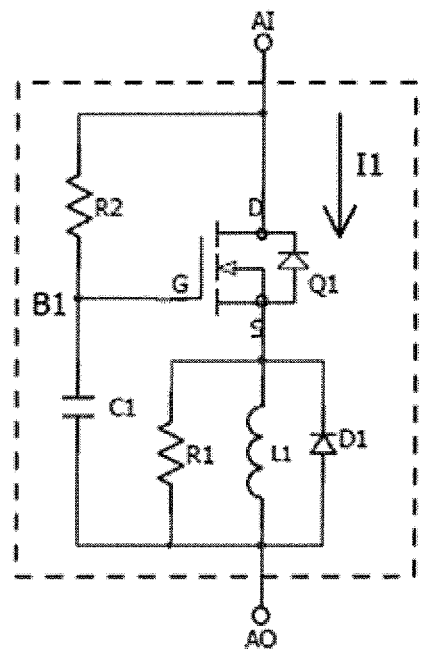
FIG. 4 illustrates a circuit diagram of a kind of the electronic inductance circuit with an N-channel FET for the power supply of a 2-wire bus intercom system according to another embodiment of the present invention.

FIG. 4 illustrates a circuit diagram of a kind of the electronic inductance circuit with an N-channel FET for the power supply of a 2-wire bus intercom system according to another embodiment of the present invention.

As shown in FIG. 4, the components of the electronic inductance circuit is similar to the ones in FIG. 3 except for an N-channel FET Q1; therefore, a main circuit path between the input terminal AI and the output terminal AO of the electronic inductance circuit is along the drain terminal and the source terminal of the N-channel FET Q1 as well as the inductor L1, and the FET Q1 and the inductor L1 are connected in series. Furthermore, the inductor L1 is connected between the source terminal of the FET Q1 and AO terminal, both the resistor R1 and the freewheeling diode D1 are individually connected to the inductor L1 in parallel, the drain terminal of said N-channel FET Q1 is connected to the input terminal AI, and the connection node B1 between the capacitor C1 and the second resistor R2 is connected to the Gate terminal of the N-channel FET Q1. The electronic inductance circuit further comprises a second diode connected to said source terminal and said drain terminal of said FET in parallel.

In summary, the circuit shown in FIG. 4 is symmetrical to the circuit in FIG. 3. With the circuit shown in FIG. 4, the voltage drop and alternating current impedance between the terminals AI and AO are also applicable to be represented by the equations (3) and (4) respectively.

According to another aspect of the present invention, it provides a device which comprises the electronic inductance circuit mentioned above. Furthermore, it also provides an intercom system which achieves larger direct current power supply for the 2-wire intercom system, and the size of the 2-wire intercom system can be larger.

Compared with the existing prior arts, the proposed solution of the present invention comprises a coil inductor with an auxiliary resistor and a freewheeling diode as alternating current feedback components. According to the equations (3) and (4), the direct current voltage drop and alternating current impedance of the electronic inductance circuit according to the present invention won't be mutually restricted, so that a large direct current power supply with sufficient alternating current impedance can be implemented by the electronic inductance circuit for the power supply of a 2-wire bus intercom system and a device thereof.

Though the present invention has been described on the basis of some preferred embodiments, those skilled in the art should appreciate that those embodiments should by no means limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:

1. An electronic inductance circuit for a power supply of a 2-wire bus intercom system, wherein said electronic inductance circuit comprises:
    a main circuit path along an inductor and a source terminal and a drain terminal of a FET between an input terminal and an output terminal of said electronic inductance circuit, in which said inductor is connected to said source terminal of said FET;
    a resistor and a freewheeling diode individually connected to said inductor in parallel; and
    a secondary circuit path along a capacitor connected with a second resistor in series between said input terminal and said output terminal, which is connected to said main circuit path in parallel.

2. The electronic inductance circuit according to claim 1, wherein said inductor and said FET are connected in series.

3. The electronic inductance circuit according to claim 1, wherein said electronic inductance circuit further comprises:
a second diode, connected to said source terminal and said drain terminal of said FET in parallel.

4. The electronic inductance circuit according to claim 1, wherein a node between said capacitor and said second resistor is connected with a gate terminal of said FET.

5. The electronic inductance circuit according to claim 1, wherein said FET is a P-channel FET.

6. The electronic inductance circuit according to claim 5, wherein said drain terminal of said P-channel FET is connected to said output terminal.

7. The electronic inductance circuit according to claim 6, wherein said inductor is connected between said input terminal and said source terminal of said P-channel FET.

8. The electronic inductance circuit according to claim 1, wherein said FET is an N-channel FET.

9. The electronic inductance circuit according to claim 8, wherein said source terminal of said N-channel FET is connected to said input terminal.

10. The electronic inductance circuit according to claim 9, wherein said inductor is connected between said source terminal of said N-channel FET and said output terminal.

\* \* \* \* \*

UNITED STATES PATENT AND TRADEMARK OFFICE
CERTIFICATE OF CORRECTION

| | |
|---|---|
| PATENT NO. | : 9,203,379 B2 |
| APPLICATION NO. | : 14/347342 |
| DATED | : December 1, 2015 |
| INVENTOR(S) | : Zhou et al. |

It is certified that error appears in the above-identified patent and that said Letters Patent is hereby corrected as shown below:

In the claims

Claim 9, line 2, delete "source" and insert --drain--.

Signed and Sealed this
Sixteenth Day of August, 2016

Michelle K. Lee
*Director of the United States Patent and Trademark Office*